US008916234B2

(12) United States Patent
Chirayil et al.

(10) Patent No.: US 8,916,234 B2
(45) Date of Patent: Dec. 23, 2014

(54) METHOD OF MAKING THIN FILM STRUCTURES AND COMPOSITIONS THEREOF

(75) Inventors: Thomas Chirayil, Danbury, CT (US); Curtis J. Zimmermann, Cold Spring, NY (US); Geoffrey M. Johnson, Wappingers Falls, NY (US)

(73) Assignee: BASF Corporation, Florham Park, NJ (US)

( * ) Notice: Subject to any disclaimer, the term of this patent is extended or adjusted under 35 U.S.C. 154(b) by 904 days.

(21) Appl. No.: 12/465,845

(22) Filed: May 14, 2009

(65) Prior Publication Data

US 2010/0136235 A1 Jun. 3, 2010

Related U.S. Application Data

(60) Provisional application No. 61/053,311, filed on May 15, 2008.

(51) Int. Cl.
*B05D 5/06* (2006.01)
*G02B 5/28* (2006.01)
*C23C 14/22* (2006.01)
*C23C 16/01* (2006.01)
*C23C 16/40* (2006.01)
*C23C 16/54* (2006.01)

(52) U.S. Cl.
CPC .............. *G02B 5/286* (2013.01); *C23C 14/225* (2013.01); *C23C 16/01* (2013.01); *C23C 16/405* (2013.01); *C23C 16/406* (2013.01); *C23C 16/545* (2013.01)
USPC .......................................... 427/162; 427/258

(58) Field of Classification Search
USPC .................................. 427/162, 258
See application file for complete search history.

(56) References Cited

U.S. PATENT DOCUMENTS

| 3,087,828 | A | | 4/1963 | Linton |
| 3,087,829 | A | | 4/1963 | Linton |
| 4,657,350 | A | | 4/1987 | Mori |
| 4,879,140 | A | | 11/1989 | Gray et al. |
| 5,171,363 | A | | 12/1992 | Phillips et al. |
| 5,850,309 | A | * | 12/1998 | Shirai et al. ................... 359/360 |
| 6,465,105 | B1 | * | 10/2002 | Johnson et al. ............... 428/426 |
| 7,246,366 | B1 | | 7/2007 | Addington et al. |
| 2005/0003302 | A1 | * | 1/2005 | Yamamoto et al. ...... 430/270.13 |
| 2006/0156957 | A1 | * | 7/2006 | Fuller et al. .................... 106/436 |
| 2007/0029561 | A1 | | 2/2007 | Cho et al. |
| 2008/0088932 | A1 | | 4/2008 | Cho |

FOREIGN PATENT DOCUMENTS

| EP | 10074519 A | 2/2001 |
| JP | 07246366 A | 9/1995 |
| JP | H07-246366 | 9/1995 |
| JP | 1996-298073 A | 11/1996 |

OTHER PUBLICATIONS

Xi J-Q et al: "Very Low-Refractive-Index Optical Thin Films Consisting of an Array of SI02 Nanorods" Optics Letters, OSA, Optical Society of America, Washington, DC, US, vol. 31, No. 5, Mar. 1, 2006, pp. 601-603, XP001238943.
Schubert Martin et al: "Distributed Bragg reflector consisting of high- and low-refractive-index thin film layers made of the same material" Applied Physics Letters, AIP, American Institute of Physics, Melville, NY, US, vol. 90, No. 14 Apr. 6, 2007, pages.
21 CFR Chapter 1 Part 73, Table of Contents, Apr. 1, 2002.
Office Action mailed Aug. 2, 2011; U.S. Appl. No. 12/465,870, filed May 14, 2009.
JP 1996-298073 Derwent Accession No. 1997-040079; Derwent Week 200110.
Final Office Action mailed Mar. 5, 2012 for U.S. Apll. No. 12/465,870, filed May 14, 2009.
International Preliminary Report on Patentability, Nov. 17, 2010 for PCT/US2009/043912, filed May 14, 2009.
Machine_English_Translation_JP_07246366_A: Yamane, Takakazu: Optical Interference Material and Coating Material Containing the Same Sep. 26, 1995: JPO: whole document.
Office Action mailed Sep. 11, 2014 in U.S. Appl. No. 12/465,870, filed May 14, 2009.

\* cited by examiner

*Primary Examiner* — Leo B Tentoni
(74) *Attorney, Agent, or Firm* — Anna-Lisa Gallo

(57) ABSTRACT

This invention is directed to a method of modifying the refractive index of multilayer thin films structure comprising high refractive and low refractive index layers, where the high refractive and low refractive index layers are of the same material, the method comprises a) depositing a first layer of film of a refractive index on a substrate; b) depositing a second layer of film having a different refractive index onto the first layer of film; and c) depositing a third layer of film having a different refractive index from the second layer of film onto the second layer of film, and compositions thereof. In certain embodiments, this multilayer thin film structure of this invention is directed to decorative applications.

21 Claims, No Drawings

US 8,916,234 B2

METHOD OF MAKING THIN FILM STRUCTURES AND COMPOSITIONS THEREOF

CROSS-REFERENCE TO RELATED APPLICATIONS

This application claims the benefit pursuant to 35 U.S.C. §119(e) of U.S. Provisional Application No. 61/053,311, filed on May 15, 2008.

FIELD OF THE INVENTION

The present invention relates to a method of making multilayer effect materials, and in particular, particulate effect materials comprising alternating high, low, high refractive index optical layers where the refractive index of at least one of the optical layers has been altered, and the compositions thereof. Also, this invention relates to effect materials formed from a low refractive index porous framework to be used as a substrate and subsequently depositing optical layers for enhanced visual effects.

BACKGROUND OF THE INVENTION

The use of effect materials, also known as pearlescent pigments or nacreous pigments, in order to impart a pearlescent luster, metallic luster and/or multi-color effect approaching iridescent, is well-known. Effect materials are composed of a plurality of laminar substrates, each of which is coated with one or more reflecting/transmitting layers of coating materials. Materials of this type derived their characteristics from metal oxides, as described in U.S. Pat. Nos. 3,087,828 and 3,087,829, and a description of their properties can be found in L. M. Greenstein, "Nacreous (Pearlescent) Pigments and Interference Pigments". Pigment Handbook, Volume I, Properties and Economics, Second Edition, pp. 829-858, John Wiley & Sons, NY 1988.

The unique appearance of effect materials is the result of multiple reflections and transmissions of light. The substrate usually has a refractive index which is different from the coating and usually also has a degree of transparency. The coating is in the form of one or more thin layers which have been deposited on the substrate. If more than one layer is used, the layers are made of materials with different refractive indices. For reflective properties, the outer layer typically has a higher index of refraction compared to the adjacent inner layers. Pearlescent luster is derived from specular reflection from the surfaces that are essentially parallel to each other.

One aspect of the coating on the substrate is that it must be smooth and uniform in order to achieve the optimum pearlescent appearance. The reason is that if an irregular surface is formed, light scattering occurs and the coated substrate may not function effectively as an effect pigment.

In addition, the first coating should adhere strongly to the adjacent coating or substrate, or else the coating may become separated during processing, resulting in considerable breakage and loss of luster. Particles which do not become attached to the substrate during preparation of the coatings on the substrate or which are the result of separation cause light scattering and impart opacity to the pigment. When there are too many of such small particles, the pearlescent appearance can be reduced or lost.

U.S. Pat. No. 5,171,363 discloses a multilayer structure comprising alternate layers of a material having a low refractive index of 1.35 to 1.65 and a material having a high refractive index of 1.7 to 2.4. One example is silicon dioxide ($SiO_2$; refractive index of 1.5) and titanium dioxide ($TiO_2$; refractive index of 2.7). The layers are formed by vacuum coating, electron beam, or sputtering. The resulting optically variable flake is used to make optically variable ink.

Japanese Patent Application No. 7-246366 discloses alternating layers of $SiO_2$ and $TiO_2$ sputtered or vaporized to form a pearlescent material for paint. The layers are applied to a substrate such as glass.

U.S. Pat. No. 4,879,140 discloses the use of plasma enhanced chemical vapor deposition to deposit multilayer films comprising alternating layers of $SiO_2$ and silica to a total of 30 layers for use as an interference filter. The patent also discloses deposition of alternating layers of $SiO_2$ and $TiO_2$ to a total of 31 layers having a total thickness of approximately 2 microns.

U.S. Patent Application Serial No. 20070029561 discloses an omni-directional reflector having a transparent conductive low-index layer formed of conductive nanorods and a light emitting diode utilizing the omni-directional reflector are provided. The omni-directional reflector includes a transparent conductive low-index layer formed of conductive nanorods and a reflective layer formed of a metal.

Despite the advances in the art, a need exists to produce unique optical materials in the form of thin films by tailoring the refractive index of a variety of materials.

In many applications, the high density of certain materials, for example, iron oxide and titanium dioxide, are problematic in formulations; hence, there is a need for low density thin film based materials where a material such as iron oxide has reduced density.

SUMMARY OF THE INVENTION

This invention is directed to a method of modifying the refractive index of multilayer thin films structure comprising high refractive and low refractive index layers, where the high refractive and low refractive index layers are of the same material, the method comprises a) depositing a first layer of film of a refractive index on a substrate; b) depositing a second layer of film having a different refractive index onto the first layer of film; and c) depositing a third layer of film having a different refractive index from the second layer of film onto the second layer of film. In an embodiment, the thin film is used for decorative applications. This invention is also directed to a method of modifying the refractive index of multilayer thin films structure comprising high refractive and low refractive index layers, the method comprises a) depositing a first layer of film of a refractive index on a substrate; b) depositing a second layer of film having a different refractive index onto the first layer of film, where the second layer film has been modified to provide for a different refractive index from its original form; and c) depositing a third layer of film having a different refractive index from the second layer of film onto the second layer of film. In an embodiment, the thin film is used for decorative applications. In an embodiment, the first layer and the third layer of film are of the same material. In an embodiment, the first layer and the third layer of film are of the same thickness, thus imparting the same refractive indices.

This invention is also directed to a method of manipulating the refractive index of multilayer thin films structure comprising high refractive and low refractive index layers, where the high refractive and low refractive index layers are comprised of $TiO_2$, the method comprises a) depositing a first layer of film of a refractive index on a substrate; b) depositing a second layer of film having a different refractive index onto the first layer of film; and c) depositing a third layer of film having a different refractive index onto the second layer of film. In an embodiment, the thin film is used for decorative applications.

This invention is also directed to a method of manipulating the refractive index of a thin film structure, which method comprises a) providing a substrate comprising a material of a refractive index that has been modified from its original or then current form; and b) depositing a layer of the same or different material as the substrate of film onto the substrate.

This invention is also directed to a method of manipulating the refractive index of a thin film structure, which method comprises a) providing a substrate comprising $TiO_2$ having a high or low refractive index that has been modified from its original or then current form; and b) depositing a layer of $TiO_2$ onto the substrate.

As used herein, the thin film layers is made of titanium dioxide, iron oxide, zirconium dioxide, zinc oxide, zinc sulfide, bismuth oxychloride, silicon nitride, titanium nitride, zirconium nitride, indium tin oxide, diamond like/graphitic films, $SiO_2$, silicon oxides, silicon carbide, tungsten carbide, ferrites, silicides, magnesium fluoride, aluminum oxide, metals including aluminum, copper, bronze, brass and silver, alloys, carbonaceous materials, zeolites, a polymer such as polymethyl methacrylate, polystyrene, ethylene vinyl acetate, polyurea, polyurethane, and polydivinyl benzene.

As used herein, the thin film layers comprise at least one materials that is certified for FD&C application as listed under 21 CFR Part 73 Subpart A—Food, Subpart B—Drugs, and Subpart C—Cosmetics.

In an embodiment, the high refractive index material is selected from the group consisting of anatase titanium dioxide, rutile titanium dioxide, iron oxide, zirconium dioxide, zinc oxide, zinc sulfide, bismuth oxychloride, silicon nitride, titanium nitride, zirconium nitride, indium tin oxide, diamond like/graphitic films, carbonaceous materials, metals, alloys, metalloids, silicon dioxide, silicon oxides, silicon carbide, tungsten carbide, ferrites, silicides or the like. The low refractive index material is porous.

This invention is also directed to a multilayer thin film structure comprising high refractive and low refractive index layers, where the high refractive and low refractive index layers are comprised of titanium dioxide, the low refractive index layer having been modified from its original or then current form from a high refractive index.

The low refractive index layer has been modified by introducing voids therein. The voids may be made from an array of nano-rod materials, or introduced morphological structures that incorporate voids in the thin film layer. See, J.-Q. Xi, Jong Kyu Kim, and E. F. Schubert, Low-refractive index films: A New Class of Optical Materials, IEEE LEOS Newsletter, Vol. 19, No. 6, December 2005.

As used herein, modified layer means material of certain refractive index, whose refractive index has been altered to either a higher or lower refractive index ratio.

As used herein, modifying a layer from its original or then current form refers to changing the morphological configuration of the individual coating layer either from its original form or from a form that has been changed.

As used herein, it is recognized that there is a need to provide interfacial coating to improve cohesion or templating purposes.

As used herein, decorative applications refer to applications in the cosmetics, automotive and industrial area.

As used herein, thin film coating is typically less than 5 mm. In certain embodiments, particularly for decorative purposes, the thin film coating may vary from about 1 angstrom to several millimeters.

As used herein, the refractive index may equal the effective refractive index where the effective refractive index is dependent on the structure and morphology of the thin film structure. For example, the refractive index of $TiO_2$ can reach its theoretical value depending on the method of thin film formation such as physical vapor deposition or a solution approach. The effective refractive index of $TiO_2$ can be modified from its theoretical value by varying the degree of crystallinity, density, and with the introduction of lower refractive index materials and voids in the thin film structure.

As used herein, in certain embodiments, the thin film structures of this invention may be formed over a substrate known to the skilled artisan. Substrates include, but are not limited to, glass flakes, mica and similar or other platelet morphology, and metal oxides.

As used herein, the high and low and high refractive index materials used in the thin film structures include their stoichiometric and non-stoichiometric forms.

DESCRIPTION OF THE INVENTION

In an embodiment, this invention takes a variety of materials traditionally used in thin film coatings and vary the refractive index to produce unique optical effects. As another example, one could tailor the films used in the interference coatings by manipulating refractive index of a single coating material.

This invention provides for applications in various forms. In certain embodiments, this is applicable irrespective if it is in a single coating material or a compilation of different coating materials in different morphological configurations.

For typical decorative interference coatings, an embodiment of this invention provides for the materials being arranged in a high/low/high index of refraction stack. The prototypical example is $TiO_2$—$SiO_2$—$TiO_2$. For anti-reflective coatings, typically, the low refractive index material is the outer layer. Contrary to convention, a unique approach would be where a decorative interference coating is made by using conventional low/high/low index of refraction materials. One embodiment is $TiO_2$—$Fe_2O_3$—$TiO_2$, yet the refractive index of the higher index $Fe_2O_3$ is reduced below that of the outer layers of $TiO_2$.

Pearlescent pigments in the art provide a high index material coated on a low index substrate. Examples of such pearlescent pigment include high index of refraction coatings of $TiO_2$ or $Fe_2O_3$ coatings on a low index of refraction substrate like mica, glass flake, silica, or aluminum oxide. One would not expect to obtain pearlescent effects by reversing the coatings, i.e., silica coatings on $TiO_2$ or $Fe_2O_3$. While a low index material coated on a higher index of refraction material may yield interesting color effects, it is not known to increase the reflectivity of white light. Such approach would be expected to produce an anti-reflective optical stack. However, with the ability to manipulate the refractive index of traditionally high index materials such as iron oxide, the convention of requiring different materials to introduce the requisite ordered sequence of refractive index can be overcome. Therefore, by tailoring traditionally high index materials to behave as a low index of refraction materials through modification of their density (air composition) conventional sequencing of materials for pearlescent effects can be overcome. One such example would be creating low density platelets of iron oxide that have an effective refractive index significantly lower than titanium dioxide. Coating titanium dioxide on such a modified low refractive index iron oxide substrate provides unique pearlescent optical effects.

There are certain benefits in the combination of absorption and transparent layers, for example, $TiO_2/TiO_2TiO_2$ or $TiO_2/Fe_2O_3/TiO_2$ or $Fe_2O_3/TiO_2/Fe_2O_3$.

Various multilayer stacking arrangements are included in this invention.

In an embodiment, a two layer arrangement includes high refractive index $TiO_2$ or $Fe_2O_3$ layer, and a porous low refractive index $TiO_2$ or $SiO_2$ layer.

In an embodiment, a three layer arrangement includes a high refractive index $TiO_2$ layer, a porous low refractive index $TiO_2$ layer, and a high refractive index $TiO_2$ layer.

In another embodiment, a three layer arrangement includes a high refractive index $Fe_2O_3$ layer, a porous low refractive index $TiO_2$ layer, and a high refractive index $Fe_2O_3$ layer.

In another embodiment, a three layer arrangement includes a high refractive index $TiO_2$ layer, a porous low refractive index $TiO_2$ layer, and a high refractive index $Fe_2O_3$ layer.

In another embodiment, a three layer arrangement includes a high refractive index $Fe_2O_3$ layer, a porous low refractive index $Fe_2O_3$ layer, and a high refractive index $Fe_2O_3$ layer.

In another embodiment, a three layer arrangement includes a high refractive index $Fe_2O_3$ layer, a porous low refractive index bronze layer, and a high refractive index $Fe_2O_3$ layer.

In another embodiment, a three layer arrangement includes a high refractive index $Fe_2O_3$ layer, a porous low refractive index copper layer, and a high refractive index $Fe_2O_3$ layer.

In another embodiment, a three layer arrangement includes a high refractive index $Fe_2O_3$ layer, a porous low refractive index chromium layer, and a high refractive index $Fe_2O_3$ layer.

In another embodiment, a three layer arrangement includes a high refractive index $Fe_2O_3$ layer, a porous low refractive index aluminum layer, and a high refractive index $Fe_2O_3$ layer.

In another embodiment, a three layer arrangement includes a high refractive index $Fe_2O_3$ layer, a porous low refractive index silver layer, and a high refractive index $Fe_2O_3$ layer.

In an embodiment, a three layer arrangement includes a high refractive index $TiO_2$ layer, a porous low refractive index carbonaceous layer, and a high refractive index $TiO_2$ layer.

In an embodiment, a three layer arrangement includes a high refractive index $TiO_2$ layer, a porous low refractive index diamond like layer, and a high refractive index $TiO_2$ layer.

In another embodiment, a three layer arrangement includes a high refractive index $Fe_2O_3$ layer, a porous low refractive index graphitic layer, and a high refractive index $Fe_2O_3$ layer.

In another embodiment, a three layer arrangement includes a silver layer, a porous low refractive index $TiO_2$ layer, and a thin silver layer.

In another embodiment, a three layer arrangement includes a high refractive index $Fe_2O_3$ layer, a porous low refractive index $TiO_2$ layer, and a high refractive index $TiO_2$ layer.

Five layer arrangements of this invention includes a high refractive index $TiO_2$ or high refractive index $Fe_2O_3$ layer, a porous low refractive index $TiO_2$, low refractive index refractive index $Fe_2O_3$, or $SiO_2$ layer, a high refractive index $TiO_2$, or high refractive index $Fe_2O_3$ layer, a porous low refractive index $TiO_2$, low refractive index $Fe_2O_3$, or $SiO_2$ layer, and a high refractive index $TiO_2$, high refractive index $Fe_2O_3$ layer.

In another embodiment, a five layer arrangement includes high refractive index $Fe_2O_3$ layer, a thin adhesive layer, a high refractive index $TiO_2$ layer, a thin adhesive layer, and a high refractive index $Fe_2O_3$ layer.

In another embodiment, a five layer arrangement includes high refractive index $Fe_2O_3$ layer, an ingestible approved polymer layer, a high refractive index $TiO_2$ layer, an ingestible approved polymer layer, and a high refractive index $Fe_2O_3$ layer.

In yet another embodiment, a five layer arrangement includes high refractive index $Fe_2O_3$ layer, an ingestible approved polymer layer, a copper layer, an ingestible approved polymer layer, and a high refractive index $Fe_2O_3$ layer.

In accordance with the present invention, the multilayer arrangement may be prepared over a substrate. The substrate may remain or be removed depending on the type of applications.

In accordance with the present invention, the middle layer of the multilayer arrangement is typically the coating layer whose layer is modified. However, depending on the application, the layer(s) other than the center layer may also be modified.

In accordance with the present invention, the effect material is a multi-layered product composed of a transparent or opaque substrate having an odd or even number of optical layers.

The substrate can be fine particulates of natural or synthetic mica, glass, aluminum oxide, zinc oxide, zirconium oxide, $Fe_2O_3$, aluminum metal, bronze metal, and copper metal. The substrate can also be an organic or inorganic web, where the multilayer stacks are first deposited using web coating techniques and then removed from the web to function as a standalone effect material.

The optical layers encapsulating the substrate alternate between high refractive index materials and low refractive index materials. In this invention, traditionally high refractive index material such as $TiO_2$ can also be used as a low refractive index layer by introducing pores into the thin film framework. For example, $TiO_2$ layer with a refractive index of 2.5 can be lowered to 1.15 by having 90% pores or air in the thin film. This invention relates to multilayer effect materials by tailoring the refractive index of thin films to generate enhanced visual effects for the use in automotive and industrial coatings, plastics, security, foods, drugs, and cosmetics applications.

The high refractive index materials can be titanium dioxide, iron oxide, zirconium dioxide, zinc oxide, zinc sulfide, bismuth oxychloride, silicon nitride, titanium nitride, zirconium nitride, indium tin oxide, metals, diamond like/graphitic films or the like. The low refractive index material can be porous thin films consisting of titanium dioxide, iron oxide, zirconium dioxide, zinc oxide, zinc sulfide, bismuth oxychloride, silicon nitride, titanium nitride, zirconium nitride, indium tin oxide, diamond like/graphitic films, $SiO_2$, silicon oxides, silicon carbide, tungsten carbide, ferrites, silicides, magnesium fluoride, aluminum oxide, metals including aluminum, copper, bronze, brass and silver, carbonaceous materials, zeolites, a polymer such as polymethyl methacrylate, polystyrene, ethylene vinyl acetate, polyurea, polyurethane, polydivinyl benzene and the like. Any combination of materials can be selected provided that adjacent layers differ in refractive index by at least about 0.2, and more preferably at least about 0.6.

In an embodiment, one or more of the high refractive materials and/or low refractive materials may be used.

The high refractive index layer on the substrate can be deposited using traditional aqueous, chemical or physical vapor deposition techniques. The low refractive index layer with a porous framework can also be applied by using sol-gel, aqueous deposition, and chemical and physical vapor deposition techniques.

In an embodiment of this invention, zeolites are used. Zeolites are porous inorganic solids with general formula $M^{x+}_{x/n}[(AlO_2)_x(SiO_2)_{1-x}] \cdot mH_2O$, and may be considered to be derived from an open pure silica structure by substituting some of the $SiO_4$ tetrahedra with $AlO_4$ tetrahedra. The introduction of aluminum for silica is accompanied by incorporating cations within the structure that compensate for the net negative charge associated with the incorporation of aluminum. These zeolite structures can be extremely porous, and void volumes greater than 50% are possible. Many structural variants are possible, depending on how the individual tetrahedral units are linked together, giving rise to one dimensional, two dimensional and three dimensional networks of channels and cavities. Void space is typically filled with water molecule and charge compensating cations, but a range of inorganic and organic species can also be enclathrated within the porous network. Many substitutions at the tetrahedral sites are possible, and $AlO_4$ and $SiO_4$ can be replaced by many tetrahedral species, including, but not limited to $GaO_4$, $GeO_4$, $PO_4$, $BeO_4$ and $ZnO_4$. Many examples of zeolite analogs exist where transition metal species are incorporated into the framework "T" positions, including Cr, As, Sn and Ti, and these can adopt both octahedral and tetrahedral coordination.

Synthesis of zeolites can be performed. Films of zeolite or zeolite analogs can be synthesized in many ways including, but not limited to, solid state synthesis or structure conversion, solution synthesis, sol-gel and hydrothermal synthesis using any or all of these techniques as appropriate, with the optional presence of surfactant or template molecules.

Zeolites impart a porous quality that can generate low refractive index material from the high refractive index material. The porous nature of the zeolites allows absorption and entrapment of the species, with potential for subsequent controlled release. Furthermore, zeolites allows for ready ion exchange, enabling the incorporation of a variety of colored transition metal species such as cobalt, copper, iron, chromium, for optical as well as functional attributes e.g. catalytic ability. It is also believed that zeolite allows the entrapment of clusters or molecules, such as inorganic anions e.g., $(MnO_4)^-$, $(MnO_4)^{2-}$, Sn— etc, as well as neutral molecules such as dyes. The ions or molecules so entrapped offer the possibility to act as sensors or triggers as a function of environment such as solvation by water molecules, change of pH, and thermal environment.

In certain embodiments, sol-gel and oblique angle evaporation techniques are used since they have been used to lower the refractive index of materials by controlling the porosity in the thin film. See, J.-Q. Xi, et al., ibid. The porous thin film can be sealed to prevent the infusion of the following higher refractive index material into the voids.

The multilayer stack concept presented in this invention can also be made on a web. A web consisting of polymers such as poly(ethylene terephthalate), metallic, or ceramic are well known in the art and can be used to deposit the desired optical layers. The multilayer stacks envisioned by this invention may be produced from a variety of web coating techniques including, however not limited to solution coating, oblique angle deposition using chemical or physical vapor deposition techniques.

A release layer is typically used to aid in the removal of optical stacks from the carrier web leading to a stand alone effect material. The removed film or particulates can be further milled and classified to the desired particle sized to be used in conventional pigment and/or effect material applications.

In addition to generating optical stacks, the invention herein provides for porous thin films with low refractive index that can also be used as a substrate. These materials with porous framework can be used as substrates with a refractive index typically lower than or equal to the standard substrates such as synthetic or natural mica, glass flakes, alumina and silica flakes. A high refractive index optical layer coating on the porous substrate will lead to products with increased reflectivity and chroma. Such a substrate can be generated by various solution and vapor techniques followed by the deposition of a high refractive index optical layer using traditional deposition methods.

An effect material consisting of a porous substrate consisting of low refractive index layer followed by the deposition of a high refractive index material can lead to higher chroma, reflectivity, and lightness compared to traditional products.

In certain embodiments, the present invention is directed to coatings of the optical materials that are certified for Food, Drug and Cosmetics (FD&C) Applications:

Color additives exempt from US Food and Drug Administration certification under 21 CFR Part 73 Subpart A—Foods (Apr. 1, 2002 edition) include diluents in color additive mixtures for food use exempt from certification, annatto extract, astaxanthin, dehydrated beets (beet powder), ultramarine blue, canthaxanthin, caramel, β-Apo-8'-carotenal, β-Carotene, cochineal extract, carmine, toasted partially defatted cooked cottonseed flour, ferrous gluconate, ferrous lactate, grape color extract, grape skin extract (enocianina), haematococcus algae meal, synthetic iron oxide, fruit juice, vegetable juice, dried algae meal, tagetes (Aztec marigold) meal and extract, carrot oil, corn endosperm oil, paprika, paprika oleoresin, phaffia yeast, riboflavin, saffron, titanium dioxide, turmeric, and turmeric oleoresin.

Color additives exempt from US Food and Drug Administration certification under 21 CFR Part 73 Subpart B—Drugs (Apr. 1, 2002 edition) include diluents in color additive mixtures for drug use exempt from certification, alumina (dried aluminum hydroxide), chromium-cobalt-aluminum oxide, ferric ammonium citrate, annatto extract, calcium carbonate, canthaxanthin, caramel, β-Carotene, cochineal extract, carmine, potassium sodium copper chlorophyllin (chlorophyllin-copper complex), dihydroxyacetone, bismuth oxychloride, synthetic iron oxide, ferric ammonium ferrocyanide, ferric ferrocyanide, chromium hydroxide green, chromium oxide greens, guanine, pyrogallol, pyrophyllite, logwood extract, mica, talc, titanium dioxide, aluminum powder, bronze powder, copper powder, and zinc oxide.

Color additives exempt from US Food and Drug Administration certification under 21 CFR Part 73 Subpart C—Cosmetics (Apr. 1, 2002 edition) include annatto, caramel, carmine, β-Carotene, bismuth citrate, disodium EDTA-copper, potassium sodium copper chlorophyllin (chlorophyllin-copper complex), dihydroxyacetone, bismuth oxychloride, guaiazulene, henna, iron oxides, ferric ammonium ferrocyanide, ferric ferrocyanide, chromium hydroxide green, chromium oxide greens, guanine, lead acetate, pyrophyllite, mica, silver, titanium dioxide, aluminum powder, bronze powder, copper powder, ultramarines, manganese violet, zinc oxide, and luminescent zinc sulfide.

In addition to the above mentioned materials, another embodiment provides for any of the layers of the optical package may be made from any natural or synthetic polymer approved for ingestion including biodegradable materials.

Traditionally, the high refractive index materials used in multilayer stacks are materials with refractive index greater that 2.0 such as $TiO_2$, $Fe_2O_3$, ZnO, BiOCl, $ZrO_2$, and metals such as bronze, copper, silver or aluminum and the low refractive index layer has been $SiO_2$ and $MgF_2$. The high refractive index layers in a multilayer stack can be the same or different.

The high refractive index layer thickness in this invention preferably has a thickness range from above 5-300 nm. In an embodiment, the low refractive index material in this invention is porous $TiO_2$, zinc oxide, silica, and $Fe_2O_3$ and while this can have other thicknesses, with another embodiment, the low refractive index layer preferably has a thickness in the range of about 20-500 nm. Low refractive materials such as $SiO_2$ and $MgF_2$ are not approved color additives for the cosmetics, drugs and food industry. By constructing a high, low, high multilayer stack strictly with $TiO_2$ or $Fe_2O_3$ has regulatory advantages, allowing its usage in the cosmetics, drugs and food industry for decorative and functional attributes. Such an effect material will also have decorative benefits with higher chroma, reflectivity and lightness for a particular hue compared to traditionally used low refractive index materials. A thicker lower refractive index layer greater than 80 nm can lead to a wide range of unique angle dependent color variable effects.

The optical properties of a pigment with porous thin film can have unique coloristic benefits in formulations and final application. For example, in a nail enamel formulation, the color of pigment may appear one color with the incorporation solvents into pigment pores and a different color once the solvent is removed during the drying process after the nail enamel is applied.

In addition, the porosity in the thin film can be filled with functional materials in food, drug, and cosmetic applications in addition to its unique coloristic properties. With the incorporation of specific materials into the pores, the pigment described in this invention can be used in applications such as drug delivery systems, security materials with the incorporation of FD&C fluorescent or phosphorescent materials, drugs, cosmeceuticals, vitamins, UV absorbers, biological material, inks, carbonaceous material, cations, anions, neutral molecules, and fragrances.

In addition to FD&C markets, the products that resulted from this invention can also be used in traditional automotive and industrial coatings, powder coating, security, and plastics applications. The automotive application would require the pigment to have an exterior treatment for weather stability, adhesion benefits and humidity resistance.

Analytical Methods
Color Measurement Methods:

The product attributes such as luster, hue, reflectivity and lightness resulting from this invention is evaluated using a drawdown on a hiding chart (Form 2-6 Opacity Charts of the Leneta Company) both visually and instrumentally. A drawdown on the black portion of the card displays the reflection color while the white portion displays the transmission color at non-specular angles. A typical drawdown preparation involves incorporating 3-12% multilayer laminar particulate in a nitrocellulose lacquer.

The drawdown is characterized using a goniospectrophotomerer (CMS-1500 from Hunter). The reflectivity v. wavelength curve is obtained at various viewing angles. The color travel for the multilayer laminar particulate is described using the CIELab L*a*b* system and the data is recorded both numerically and graphically.

Example 1

A laminar structure comprising $TiO_2/TiO_2$-Low RI/$TiO_2$ on a web is made as follows. The general process followed is that outlined in U.S. Pat. No. 6,186,090. A 1 m×500 m roll of polyethylene terephthalate (PET) carrier with a release coating is inserted into a roll coating chamber. The chamber is maintained at reduced pressure consisting of a nitrogen and argon atmosphere. The chamber is equipped with both plasma enhanced chemical vapor deposition (PECVD) and physical vapor deposition (PVD) capabilities. The PET is fed via a sequence of rollers through a PECVD deposition zone where titanium dioxide (titania) is deposited onto the PET from tetrakis(dimethyl amido) titanium also known as TDMAT. Following the titania deposition the coated carrier continues to the next deposition chamber where $TiO_2$ thin film with tailored refractive index by depositing a porous thin film using oblique angle deposition. The laminar multicoated PET is further fed to another deposition zone where titania is deposited from TDMAT consistent with the first deposited layer. Following the last deposition, the deposition chamber is vented to atmospheric, and the PET coated roll is transferred to an isolated chamber consisting of a roll transfer unit, doctor blade, air knife, sonification and solution tank. Within the isolated chamber, the optical package consisting of $TiO_2/TiO_2$-low RI/$TiO_2$ is removed from the PET resulting in high purity lamellar flakes meeting the criteria of components exempt from FDA certification under 21 CFR §73.2575 and §73.2647. The entire process is consistent with general clean room conditions and GMP criteria. The resulting structure is a three layer arrangement.

Example 2

Same as inventive example one except the high refractive index layers are $Fe_2O_3$ or a combination of $Fe_2O_3$ and $TiO_2$. The resulting structure is a three layer arrangement.

Example 3

Same as inventive example one the multilayer stack is a five layer arrangement and utilize the stack structure sequences described in inventive example one and two. The resulting structure is a five layer arrangement.

Example 4

Same as inventive example one except the high refractive index layers are $Fe_2O_3$ or a combination of $Fe_2O_3$ and $TiO_2$. The resulting structure is a three layer arrangement.

Example 5

A laminar structure as in Example 1 is prepared on a web using sol-gel process. A dense thin film of high refractive index $TiO_2$ is prepared from sol-gel process using titanium alkoxide precursors using dip coating techniques. A nanoporous thin film material with a lower refractive index from sol-gel process is known in the art. See, J.-Q. Xi, et al., ibid. The multilayer stack is pyrolyzed to generate $TiO_2$ thin films and the resulting product demonstrates increased reflectivity and chroma.

Example 6

A web coating technique, as in Example 1 and 5. using either oblique angle deposition or sol-gel process is used to deposit a porous or a lower density $TiO_2$ layer with a thickness of 0.1-1.0 microns. The $TiO_2$ layer is removed from the web, followed by milling and classification to get the desired particle size distribution. The porous $TiO_2$ layer is expected to have refractive index equal to or less than conventional substance known in the art. A high refractive index $TiO_2$, ZnO or $Fe_2O_3$ is deposited on the porous $TiO_2$ substrate to generate a product with increased reflectivity and chroma compared to traditional products.

Example 7

The products prepared from inventive examples 1 to 6 have a porous matrix. These products are then immersed in a solution containing fluorescent nanoparticles to incorporate them into the pores. Such a product can fluoresce with the exposure of UV light and is used in security applications.

Example 8

A product prepared according to Example 2 is incorporated into polypropylene step chips at 1% concentration. The step chips are appropriately named since they have graduating thickness at each step across the face of the chip. The graduating steps allow one to examine the different effect of the product based on polymer thickness.

Example 9

A product prepared according to Example 4 is incorporated into nail enamel. 10 g of the multilayer laminar particulate is mixed with 82 g of suspending lacquer SLF-2, 4 g lacquer 127P and 4 g ethyl acetate. The suspending lacquer SLF-2 is a generic nail enamel consisting of butyl acetate, toluene, nitrocellulose, tosylamide/formaldehyde resin, isopropyl alcohol, dibutyl phthalate, ethyl acetate, camphor, n-butyl alcohol and silica.

Example 10

A product prepared according to Example 5 is incorporated into a non-nitrocellulose enamel system. 10 g of the multilayer laminar particulate is mixed with 82 g of Avalure AC 315 polymer, an acrylic polymer in ethanol, and acetone is used in place of nitrocellulose.

Example 11

A 10% by weight product from example 6 is sprayed in a polyester TGIC powder coating from Tiger Drylac using a PGI corona Gun #110347. The product is mixed in a clear polyester system and sprayed over a RAL 9005 black powder sprayed base. The product is mixed into a RAL 9005 black pigmented polyester powder. The product is highly attracted to the ground metal panel. Additionally, due to its high affinity to orient closely to the surface it produces a finish that is high in distinctness of image (DOI). It does not require an additional clear coat to reduce protrusion often caused by traditional pearlescent and metal flake pigments.

Example 12

A 10% dispersion of the product prepared according to Example 3 is mixed into a clear acrylic urethane basecoat clearcoat paint system DBX-689 (PPG) along with various PPG tints to achieve desired color. The tint pastes consist of organic or inorganic colorants dispersed at various concentrations in a solvent borne system suitable with the DMD Deltron Automotive Refinish paint line from PPG. The complete formulation is sprayed using a conventional siphon feed spraygun onto 4"×12" curved automotive type panels supplied by Graphic Metals. The panel is clear coated with PPG 2001 high solids polyurethane clear coat and air dried.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of making a thin film structure comprising alternating high refractive and low refractive index layers, the method comprising:
   a) depositing a first layer of film on a substrate, the first layer having a high refractive index, wherein the refractive index is greater than 2.0;
   b) depositing a second layer of film onto the first layer of film, wherein the second layer of film is a material modified to have a different refractive index from the unmodified material, the second layer having a low refractive index, wherein the ratio of the low refractive index to the refractive index of the first layer is no more than 0.46; and
   c) depositing a third layer of film onto the second layer of film, the third layer having a high refractive index, wherein the refractive index is greater than 2.0,
   wherein the layers are of the same material.

2. The method of claim 1, wherein the second layer of film is porous.

3. The method of claim 1, wherein the material is selected from the group consisting of titanium dioxide, iron oxide, zirconium dioxide, zinc oxide, zinc sulfide, bismuth oxychloride, silicon nitride, titanium nitride, zirconium nitride, indium tin oxide, a diamond like film, a graphitic film, a metal selected from the group consisting of aluminum, copper, bronze, brass and silver, an alloy, a carbonaceous material, a zeolite, silicon dioxide, silicon oxide, silicon carbide, tungsten carbide, a ferrite, a silicide, magnesium fluoride, and aluminum oxide.

4. The method of claim 1, wherein the material is titanium dioxide or $Fe_2O_3$.

5. The method of claim 1, wherein the material is titanium dioxide and the refractive index of the second layer is 1.15.

6. The method of claim 1, wherein the material comprises an additive selected from the group consisting of color additives, wherein the color additives are exempt from US Food and Drug Administration certification under 21 CFR Part 73 Subparts A, B or C (Apr. 1, 2002 edition).

7. The method of claim 1, further comprising
   d) depositing a fourth layer of film onto the third layer of film, the fourth layer having a low refractive index; and
   e) depositing a fifth layer of film onto the fourth layer of film, the fifth layer having a high refractive index.

8. The method of claim 1, wherein the substrate is a web and wherein the method further comprises:
   d) removing the thin film structure from the web.

9. A method of making a thin film structure, the method comprising:
   a) providing a substrate, wherein the substrate consists of a porous thin film of a material selected from the group consisting of titanium dioxide, iron oxide, zirconium dioxide, zinc oxide, zinc sulfide, bismuth oxychloride, silicon nitride, titanium nitride, zirconium nitride, indium tin oxide, a diamond like film, a graphitic film, a metal, an alloy, a carbonaceous material, a zeolite, silicon dioxide, silicon oxide, silicon carbide, tungsten carbide, a ferrite, a silicide, magnesium fluoride, aluminum oxide, and a polymer, wherein the thin film has a low refractive index; and b) depositing a layer of film onto the substrate, wherein the layer of film has a high refractive index and the layer material is the same as the substrate material;

wherein the high refractive index is greater than the low refractive index by at least 0.2.

10. The method of claim 9, wherein the substrate is a porous thin film of titanium dioxide, $Fe_2O_3$ or $SiO_2$.

11. The method of claim 9, wherein the layer of film material is titanium dioxide, ZnO or $Fe_2O_3$.

12. The method of claim 9, wherein the substrate and the layer of film are titanium dioxide.

13. The method of claim 9, wherein the material of at least one of the substrate and the layer of film comprises an additive selected from the group consisting of color additives, wherein the color additives are exempt from US Food and Drug Administration certification under 21 CFR Part 73 Subparts A, B or C (Apr. 1, 2002 edition).

14. The method of claim 9, the high refractive index is greater than 2.0.

15. A method of making a thin film structure comprising alternating high refractive and low refractive index layers, the method comprising:

a) depositing a first layer of film on a substrate, the first layer having a high refractive index, wherein the refractive index is greater than 2.0;

b) depositing a second layer of film onto the first layer of film, wherein the second layer of film is a material modified to have a different refractive index from the unmodified material, the second layer having a low refractive index, wherein the low refractive index is at least about 0.2 less than the high refractive index; and c) depositing a third layer of film onto the second layer of film, the third layer having a high refractive index, wherein the refractive index is greater than 2.0, wherein the second layer of film material is different from at least one of the first layer of film material and the third layer of film material.

16. The method of claim 15, wherein the second layer of film is porous.

17. The method of claim 15, wherein the material of the first and third layers is selected from the group consisting of titanium dioxide, iron oxide, zirconium dioxide, zinc oxide, zinc sulfide, bismuth oxychloride, silicon nitride, titanium nitride, zirconium nitride, indium tin oxide, a metal, a diamond like film and a graphitic film.

18. The method of claim 15, wherein the material of the second layer of film is selected from the group consisting of titanium dioxide, iron oxide, zirconium dioxide, zinc oxide, zinc sulfide, bismuth oxychloride, silicon nitride, titanium nitride, zirconium nitride, indium tin oxide, a diamond like film, a graphitic film, a metal selected from the group consisting of aluminum, copper, bronze, brass and silver, an alloy, a carbonaceous material, a zeolite, silicon dioxide, silicon oxide, silicon carbide, tungsten carbide, a ferrite, a silicide, magnesium fluoride, aluminum oxide, and a polymer selected from the group consisting of polymethyl methacrylate, polystyrene, ethylene vinyl acetate, polyurea, polyurethane, and polydivinyl benzene.

19. The method of claim 15, wherein the material of at least one of the first, second and third layers comprises an additive selected from the group consisting of color additives, wherein the color additives are exempt from US Food and Drug Administration certification under 21 CFR Part 73 Subparts A, B or C (Apr. 1, 2002 edition).

20. The method of claim 15, wherein the material of the first layer, the material of the second layer, and the material of the third layer, respectively, are selected from: $TiO_2/TiO_2/TiO_2$; $TiO_2/Fe_2O_3/TiO_2$; $Fe_2O_3/TiO_2/Fe_2O_3$; $TiO_2/TiO_2/Fe_2O_3$; $Fe_2O_3/Fe_2O_3/Fe_2O_3$; $Fe_2O_3$/a metal/$Fe_2O_3$; and $Fe_2O_3/TiO_2/TiO_2$.

21. The method of claim 15, further comprising d) depositing a fourth layer of film onto the third layer of film, the fourth layer having a low refractive index; and e) depositing a fifth layer of film onto the fourth layer of film, the fifth layer having a high refractive index.

* * * * *